United States Patent [19]

Nagaraj

[11] Patent Number: 4,894,620
[45] Date of Patent: Jan. 16, 1990

[54] SWITCHED-CAPACITOR CIRCUIT WITH LARGE TIME CONSTANT

[75] Inventor: Krishnaswamy Nagaraj, Scotch Plains, N.J.

[73] Assignee: AT&T Bell Laboratories, Murray Hill, N.J.

[21] Appl. No.: 179,714

[22] Filed: Apr. 11, 1988

[51] Int. Cl.$^4$ ............................ G06G 7/18; H03B 1/00
[52] U.S. Cl. .................................... 328/127; 307/520; 307/521; 328/167
[58] Field of Search ....................... 328/127, 165, 167; 307/110, 520, 521, 555, 556; 330/9

[56] References Cited

U.S. PATENT DOCUMENTS

| | | | |
|---|---|---|---|
| 4,393,351 | 7/1983 | Gregorian et al. | 328/127 |
| 4,404,525 | 9/1983 | Amir et al. | 328/167 |
| 4,543,534 | 9/1985 | Temes et al. | 330/9 |
| 4,617,481 | 10/1986 | Masuda et al. | 330/9 |

OTHER PUBLICATIONS

"Increasing the Clock Frequency of Switched-Capacitor Filters", *Electronic Letters*, vol. 16, Viswanathan et al., 1980, pp. 316–317.
"A Family of Active Switched-Capacitor Biquad Building Blocks", *Bell System Technical Journal*, vol. 58, P. Fleisher et al., Dec. 1979, pp. 2235–2269.
"Switched-Capacitor Circuit Design", *Proc. IEEE*, vol. 71, Gregorian et al., Aug. 1983, pp. 941–966.
"An Area-Efficient Approach to the Design of Very Large Time Constants in Switched-Capacitor Integrators", *IEEE J. Solid-State Circuits*, vol. SC-19, Sansen et al., Oct. 1984, pp. 772–779.
"Large Time-Constant SC Circuits and Uni-Value Capacitor SC Circuits Using Multi-Phase Clock", *Proc. IEEE, International Symposium on Circuits and Systems*, M. Yamamoto, May. 1982, pp. 225–228.

*Primary Examiner*—Stanley D. Miller
*Assistant Examiner*—Richard Roseen
*Attorney, Agent, or Firm*—Jerry W. Herndon

[57] ABSTRACT

A switched capacitor circuit with a very large time constant. Numerous low frequency analog applications, modems for example, require this type of circuit. The capacitances required to obtain a sufficiently large time constant are reduced over prior art techniques by as much as 50%. The circuit is insensitive to parasitic capacitances. The circuit comprises a switched input sampling capacitor, an operational amplifier and a first feedback capacitor connected in parallel with the amplifier. The switched sampling capacitor samples an input signal in a first clock phase. A second feedback capacitor is switched during the first phase to sample the output of the operational amplifier; and, in a second phase, it is switched in parallel with the first feedback capacitor of the amplifier.

8 Claims, 6 Drawing Sheets

SWITCHED-CAPACITOR CIRCUIT WITH LARGE TIME CONSTANT

FIELD OF THE INVENTION

The invention relates to the field of switched-capacitor circuits in which the operating frequencies of interest are small in comparison to the clock speed operation of the circuits and in which, therefore, large capacitance ratios are needed to realize the necessary large time constants required for operation.

BACKGROUND OF THE INVENTION

The realization of very large time constant circuits (circuits which have a very large ratio between the operating clock frequency and the pole/zero frequencies) is a bottleneck in the design of many analog integrated circuits. Examples of this in voice-band circuits are power supply rejection filters, such as 60 Hz/180 Hz notch filters and automatic gain control loop filters which have pole frequencies of a few Hz. The clock frequencies used for these filters are usually much higher, for example, 128 KHz, as determined by the rest of the switched-capacitor circuitry in the system.

The preferred technology for realizing switched capacitor circuits has been and is presently metal oxide semiconductor (MOS) technology. There have been a number of solutions to the problem of designing such circuits using the MOS technology. A paper entitled "Switched-Capacitor Circuit Design" by R. Gregorian et al., *Proceedings of the IEEE*, Vol. 71, August 1983, pp. 941-966, surveys the field. In general, the realization of a MOS switched capacitor circuit having a large integrating time constant is achieved by replacing the input resistor of a conventional active RC integrator with a capacitive network that simulates a resistance. One such network consists of two transistor switches serially connected to an input of an operational amplifier and a capacitor connected from the common point between the switches to ground. The two switches are operated in different clock phases. The integrating time constant thus obtained depends inversely on the operating clock frequency and proportionally on the ratio of the integrating capacitance in shunt with the amplifier and the effective switched input capacitance.

Lowering the clock frequency to achieve larger time constants in the above circuit is not a viable alternative in many applications. Thus, the ratio of integrating capacitance to input capacitance must be increased. Decreasing the input capacitance to increase this ratio is not desirable because parasitic capacitances then begin to play a dominant role. Thus, the integrating capacitance must be increased. This solution, however, requires large amounts of chip area.

The problems of the above-described arrangement led to the use of the now standard input T-capacitor network. This arrangement is discussed in a paper entitled "An Area-Efficient Approach to the Design of Very Large Time Constants in Switched-Capacitor Integrators" by Sansen et al., *IEEE Journal of Solid-State Circuits*, Vol. SC-19, October 1984, pp. 772-779. The T-network approach has the advantage that it can easily be mixed with conventional switched-capacitor circuitry. However, it suffers from a strong sensitivity to parasitic capacitances, thus causing significant deviations in the time constant of the integrator. The high parasitic sensitivity places constraints on the design and layout of circuits using these integrators. This partially nullifies the area advantage of the technique.

Other known approaches for realizing very large time constants suffer from more serious limitations. A method proposed by M. Yamamoto, "Large Time-Constant SC Circuits and Uni-Value Capacitor SC Circuits Using Multi-Phase Clock", *Proceedings of the IEEE, International Symposium on Circuits and Systems*, May 1982, is parasitic-sensitive, apart from requiring a multi-phase clock. An approach given by Viswanathan et al., "Increasing the Clock Frequency of Switched-Capacitor Filters", *Electronic Letters*, Vol. 16, 1980, relies on switching in more than two clock phases and does not yield simple circuits. Also, the way the switching is performed between the separate functions of input attenuation and integration results in an undesirable slewing of its output.

SUMMARY OF THE INVENTION

The above problems are solved, and an advance in the art is achieved in an analog circuit comprising amplifying means, a switched capacitor network connected between a signal input and an input of the amplifying means and a feedback capacitance connected between an output of the amplifying means and the input to the amplifying means. The switched capacitor network includes a sampling capacitance which is switched during a first clock phase to sample an input signal and to transfer the resulting sample charge to the feedback capacitance. During a second clock phase, the sampling capacitance is switched to withdraw the same charge from the feedback capacitance. The circuit further includes a third capacitance which is switched in one of the clock phases to acquire a charge from the output of the amplifying means and which is switched in the other clock phase to distribute any charge acquired during the one clock phase with the feedback capacitance.

In the preferred embodiment, the sampling capacitance has one connection to the input of the amplifying means and a second connection switched in the first clock phase to the signal input and switched in the second clock phase to a reference potential. The third capacitance is connected between the output of the amplifying means and the reference potential during one of the clock phases and is connected in parallel with the feedback capacitance during the other of the clock phases.

DETAILED DESCRIPTION

Figure 1:
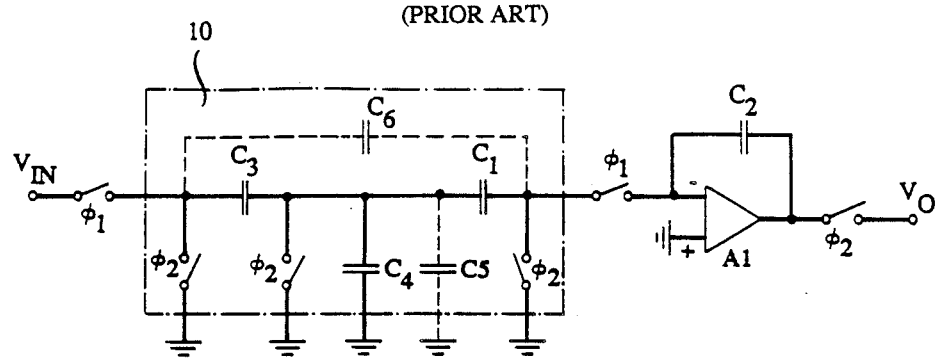
FIG. 1 shows a prior art circuit using the T-network type of input capacitance.

A conventional T-network 10 switched capacitor integrator is shown in FIG. 1. Magnification of the ratio of the integrating capacitor $C_2$ to the effective input capacitance in this circuit is achieved by attenuating the input to the integrator by means of the T-network comprising the capacitors $C_1$, $C_3$ and $C_4$. The designations $\phi_1$ and $\phi_2$ beside switches shown in this circuit indicate that the respective switch is operated (closed) during the indicated clock phase $\phi_1$ or $\phi_2$. $\phi_1$ and $\phi_2$ are mutually exclusive. That is, while $\phi_1$ is on, $\phi_2$ is off, and vice versa. These same clock phase designations are used consistently in the remaining figures.

It can be shown that the time constant of the integrator of FIG. 1 is approximately given by:

$$\tau = \left(1 + \frac{C_1}{C_4} + \frac{C_3}{C_4}\right) \frac{C_4 C_2}{C_3 C_1 f_c} \quad (1)$$

It is seen that the time constant is determined by the product of two capacitor ratios $C_4/C_3$ and $C_2/C_1$. This enables the realization of large time constants with moderate capacitor ratios. However, this circuit suffers from a strong sensitivity to parasitic capacitances. A parasitic capacitance $C_5$ at the T-junction directly affects the effective value of $C_4$. A more serious problem arises if there is any wiring parasitic capacitance between the bottom plates of $C_3$ and $C_1$. This parasitic appears as a capacitor $C_6$ in shunt with the small effective capacitance generated by the T-network, thus causing significant deviations in the time constant of the integrator.

Figure 2:
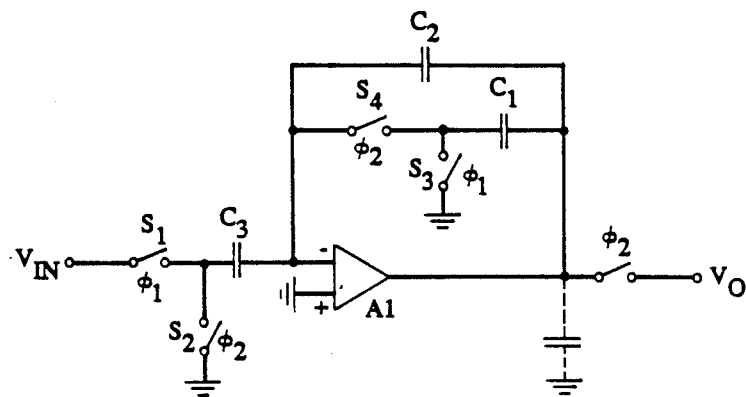
FIG. 2 shows an inverting integrating circuit built in accordance with the principles of the invention.

The circuit schematic of an inverting integrator designed in accordance with the principles of the invention is shown in FIG. 2. The operation of this circuit is as follows. During a clock phase $\phi_1$, switch $S_1$ is operated, an input signal $V_{in}$ is sampled by capacitor $C_3$, and its resulting charge $C_3*V_{in}$ is transferred to a feedback capacitor $C_2$. Also, switch $S_3$ is operated and the resulting intermediate output voltage at the output of operational amplifier A1 is sampled by capacitor $C_1$. Thereafter, during clock phase $\phi_2$, switches $S_2$ and $S_4$ are operated, and $S_1$ is opened causing $C_3$ to withdraw the charge $C_3*V_{in}$ from $C_2$. During $\phi_2$, $C_1$ distributes its charge with $C_2$. Physically, this entire operation is approximately equivalent to attenuating the input voltage $V_{in}$ by a factor $C_3/C_2$, and then integrating it onto $C_2$ through the capacitor $C_1$. Thus, the capacitor $C_2$ performs the dual functions of input attenuation and integration without having to break the feedback loop around the amplifier A1. It can be shown that the time constant of this integrator is approximately given by:

$$\tau = (1 + C_1/C_2) \frac{C_2 C_2}{C_1 C_3 f_c} \quad (2)$$

Equation 2 shows that we can realize large time constants with modest values for the capacitor ratios $C_2/C_1$ and $C_2/C_3$. Moreover, this integrator is insensitive to all parasitics to ground because every capacitor node point is held at a nonfloating potential during every clock phase, as opposed to the T-network of FIG. 1, for example, where the common node between $C_1$, $C_3$ and $C_4$ is at a floating potential during $\phi_1$. Also, since the capacitor $C_3$ of FIG. 2 is significantly larger than the small effective input capacitance of the T-network, the circuit of FIG. 2 is less sensitive to wiring capacitance. The circuit is simpler than the T-network integrator in terms of the number of capacitors and switches More important, it is seen that both the ratios $C_2/C_1$ and $C_2/C_3$ share the same large capacitor $C_2$, unlike in the T-network approach. This can result in a saving of as much as 50% in total required capacitance.

Figure 3:
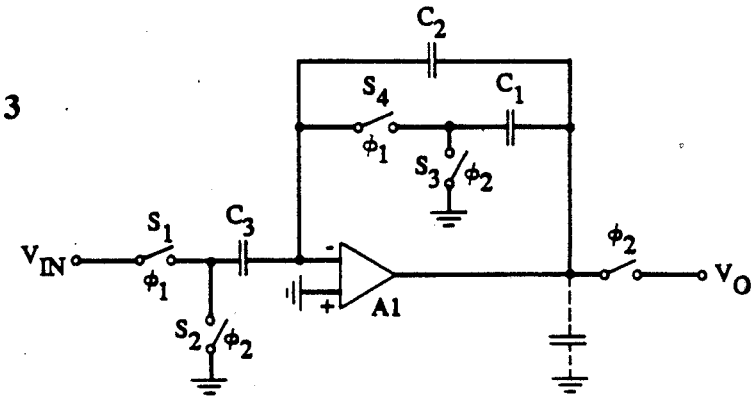
FIG. 3 shows a non-inverting version of the circuit of FIG. 2.
Figure 1:
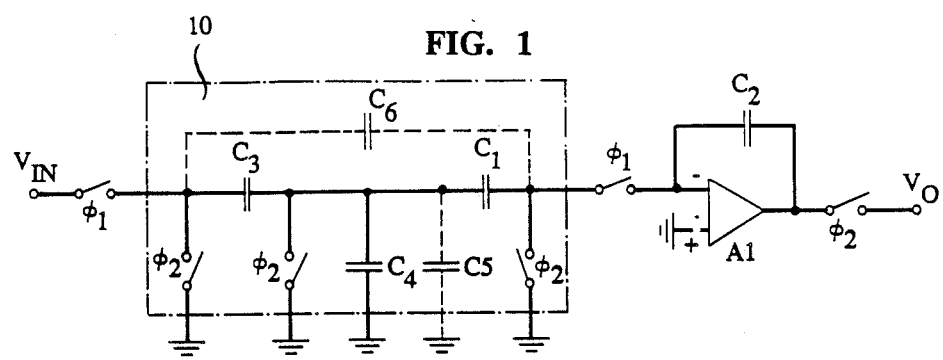
Figure 2:
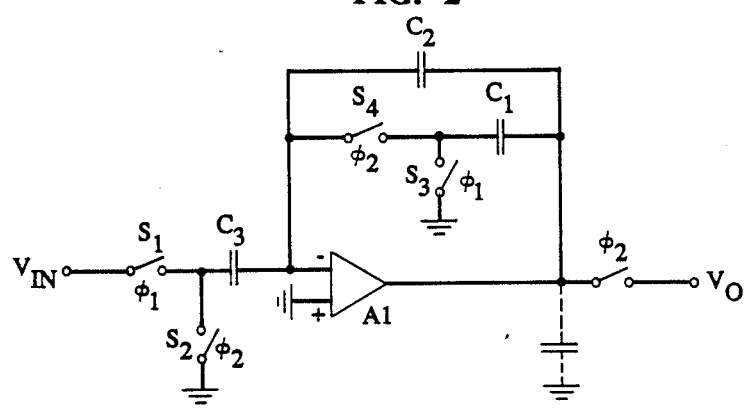
Figure 3:
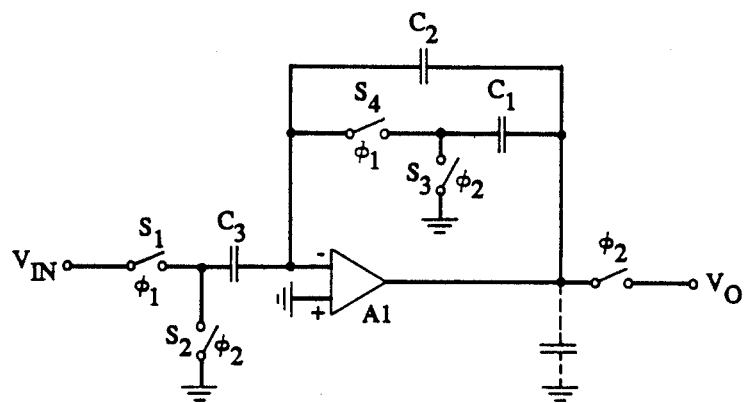

The circuit schematic of a lossless non-inverting integrator, based on the circuit of FIG. 2, is shown in FIG. 3. This circuit differs from the inverting integrator of FIG. 2 only in the clock phases used to operate switches $S_3$ and $S_4$.

Figure 4:
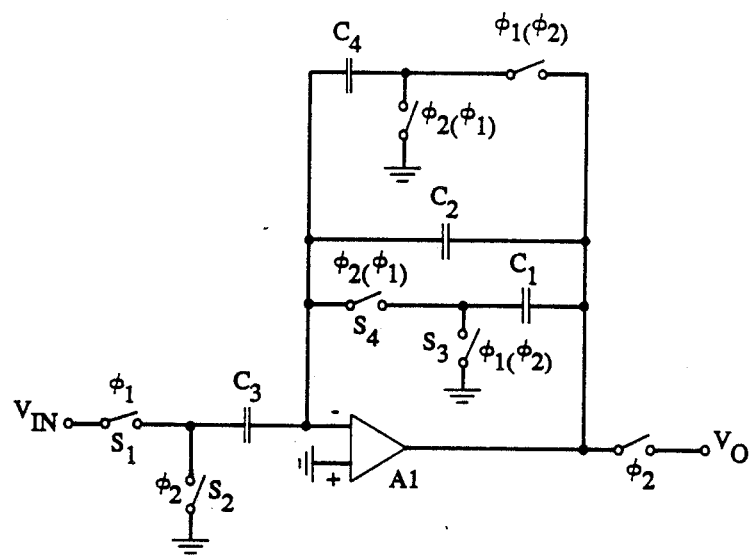
FIG. 4 shows an example of a lossy integrator using the principles of the circuits of FIG. 2 and FIG. 3.

The invention can be extended to realize lossy integrators, as shown in FIG. 4. A lossy inverting integrator is obtained by using the clock phases which are shown outside the parentheses in FIG. 4. A non-inverting lossy integrator is obtained by using the clock phases shown inside the parentheses. In addition to magnifying the ratio $C_2/C_3$ in accordance with the principles already discussed, the ratio $C_2/C_4$ is also enhanced in accordance with the same inventive principles, which is desirable in a lossy type of circuit. This is achieved by virtue of the fact that the amplifier output is an input to $C_4$ in the same way that the input signal $V_{in}$ is an input to $C_3$. The transfer function of this integrator can be shown to be:

$$H(z) = -\frac{1}{k} \frac{C_1}{C_2} \frac{C_3}{C_2} \frac{z^{-1/2}}{1 - z^{-1} + \frac{1}{k}\frac{C_1}{C_2}\frac{C_4}{C_2}z^{-1}} \quad (3)$$

$$\text{where } k = \left(1 + \frac{C_1}{C_2}\right)\left(1 + \frac{C_4}{C_2}\right)$$

Equation 3 shows that a very low pole frequency can be achieved without the need for very large capacitor ratios.

Figure 5:
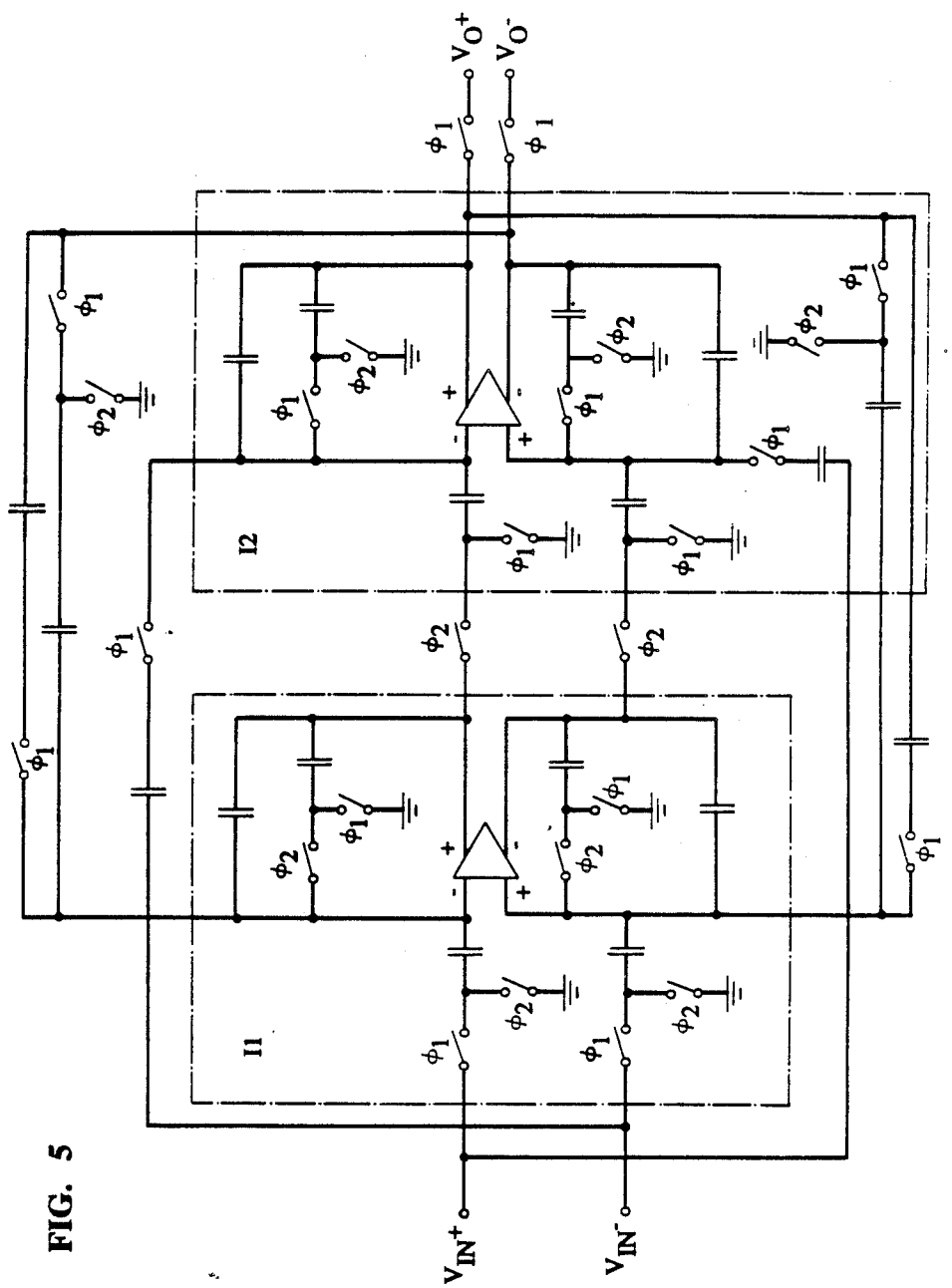
FIG. 5 shows an example of a notch filter using the principles of the circuits of FIG. 2 and FIG. 3.

The integrators of FIGS. 2 through 4 can be used as generic building blocks to realize a variety of switched-capacitor filters including first-order sections, biquads and ladder realizations. The circuit schematic of one possible implementation of a notch filter, using the principles of the invention, is shown in FIG. 5. Such a filter is generally employed as a power supply rejection filter in analog systems. This circuit is based on the well-known E-type biquadratic section. The E-type quadratic section is discussed in detail in an article entitled "A Family of Active Switched-Capacitor Biquad Building Blocks" by P. Fleisher et al. in the *Bell System Technical Journal*, Vol. 58, December 1979, pp. 2235-2269. A differential configuration has been chosen here because of the particular application for which this filter was designed. A single-ended version can be realized along the same lines. It is seen that the clock phases for the two integrators I1 and I2 in the biquad are staggered. This is required because the output of each integrator is valid only during one of the two clock phases. Similarly, in ladder structures using these integrators, the clock phases of the integrators which form loops must be staggered.

Figure 6:
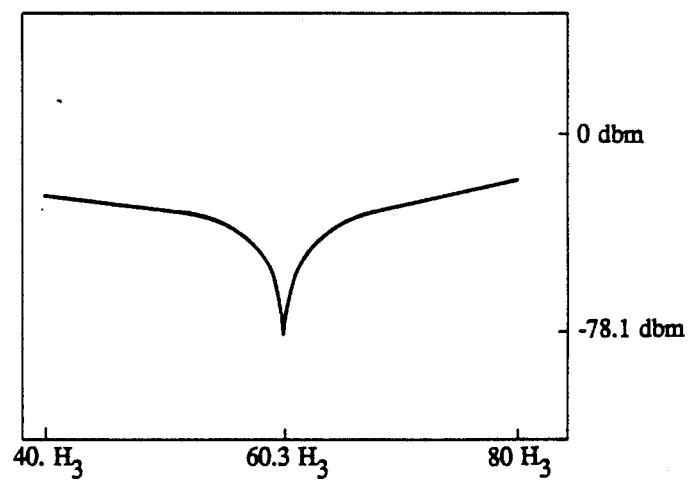
FIG. 6 shows a typical frequency response curve of the notch filter of FIG. 5.

A 60-Hz notch filter based on the configuration of FIG. 5 has been designed to work with a clock frequency of 126 KHz. This filter has been implemented in 1.5 micron CMOS. The filter uses 250 units (one unit=0.25 pf) of capacitance, a significant saving over the T-network implementation which needs about 325 units of capacitance. The chip area saving, in practice, is higher because special design and layout constraints do not have to be used to overcome the parasitic sensitivity of the T-network. The frequency response of this notch filter is shown in FIG. 6. Measurements on several samples showed a standard deviation of 0.5% in the notch frequency. In contrast, T-network implementations have often shown deviations in excess of 5%.

Figure 7:
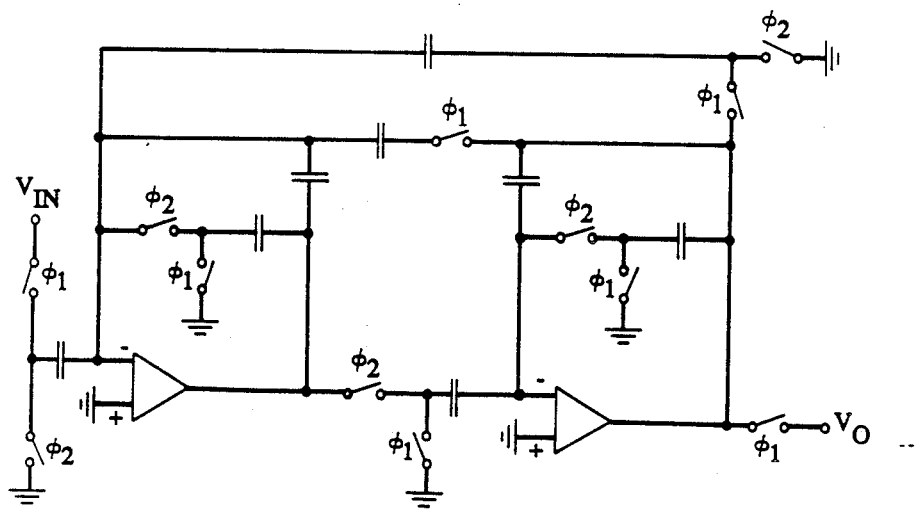
FIGS. 7, 8 and 9 show examples of a low-pass biquadratic filter stage, a band-pass biquadratic filter stage and a stage of a ladder circuit, respectively, each using the principles of the circuits of FIG. 2 and FIG. 3.
Figure 8:
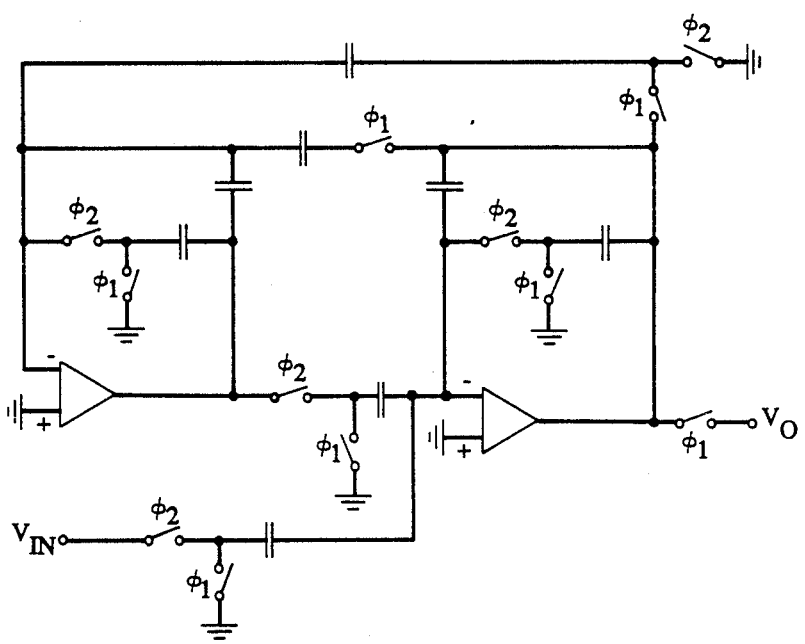
Figure 9:
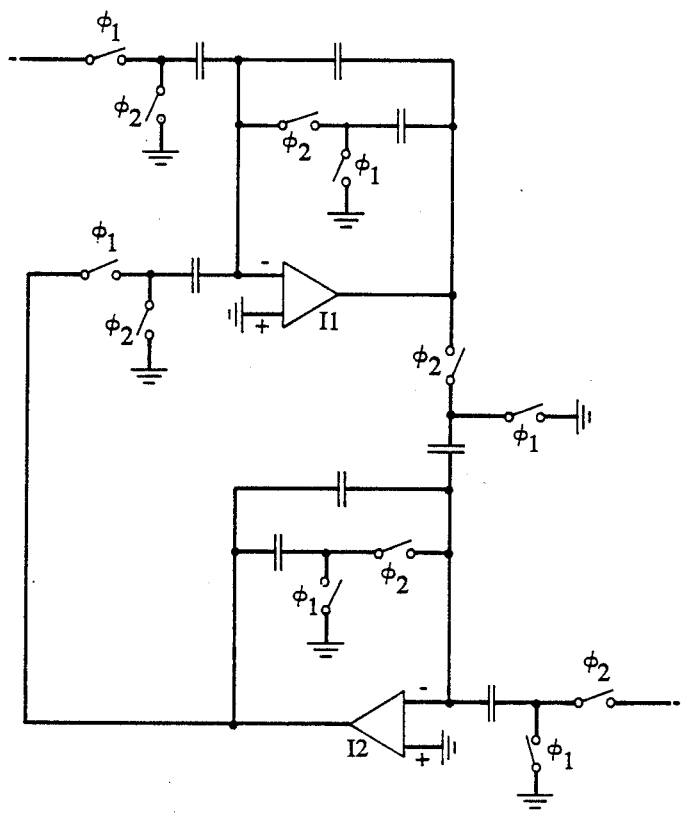

Other filter examples using the integrators of FIGS. 2 and 3 are shown in FIGS. 7 through 9. Specifically, FIG. 7 shows a low-pass biquadratic filter stage. This stage is based on the well-known E-type biquadratic topology described in the above-cited *Bell System Technical Journal*. In particular, this stage realizes the z-domain transfer function of the type $$\frac{kz^{-1}}{1 + \alpha z^{-1} + \beta z^{-2}},$$

where k, $\alpha$ and $\beta$ are constants.

FIG. 8 shows a band-pass biquadratic stage. This stage is also based on the E-type biquadratic topology. It realizes the transfer function of the type $$\frac{kz^{-1}(1 - z^{-1})}{1 + \alpha z^{-1} + \beta z^{-2}}.$$

FIG. 9 shows an integrating loop stage for a ladder filter. The loop contains two integrators consisting of an inverting lossless integrator I1 and a noninverting lossless integrator I2. Several such integrator loops may be interlaced to form ladder filters of the types described in an article by R. Gregorian, "Switched-Capacitor Circuit Design," *Proc. IEEE*, Vol. 71, pp. 941-966, August 1983.

It is to be understood that the above-described arrangements are merely illustrative of the application of principles of the invention and that other arrangements may be devised by workers skilled in the art without departing from the spirit and scope of the inventions.

What is claimed is:

1. An analog device including a first circuit, the first circuit comprising amplifying means, a switched capacitor network connected between a signal input and an input of the amplifying means and a first feedback capacitance connected between an output of the amplifying means and the input to the amplifying means, said first circuit being CHARACTERIZED IN THAT the switched capacitor network comprises a sampling capacitance switched during a first clock phase for sampling an input signal at the signal input for transferring the resulting sample charge to the first feedback capacitance and switched during a second clock phase to withdraw the same charge from the first feedback capacitance, and wherein the first circuit is further CHARACTERIZED BY a second feedback capacitance switched in one of the clock phases to acquire a charge proportional to the output voltage of the amplifying means and switched in other of the phases to distribute any charge acquired during said one clock phase with the first feedback capacitance.

2. The circuit of claim 1 wherein the sampling capacitance has one connection to the input of the amplifying means and a second connection switched in the first clock phase to the signal input and switched in the second clock phase to a reference potential.

3. The circuit of claim 1 or claim 2 wherein the second capacitance is connected between the output of the amplifying means and the reference potential during said one clock phase and is connected in parallel with the first feedback capacitance during said other clock phase.

4. The circuit of claim 1 wherein the switched capacitance network is FURTHER CHARACTERIZED BY a sampling capacitor having first and second terminals, the second terminal being connected to the input of the amplifying means, a first switch operated during the first clock phase to connect the signal input to the first terminal of the sampling capacitor, and a second switch operated during the second clock phase to connect the first terminal of the sampling capacitor to a reference potential.

5. The circuit of claim 1 wherein the second feedback capacitance is FURTHER CHARACTERIZED BY a second feedback capacitor having first and second terminals, with a second terminal connected to the output of the amplifying means, a third switch operated in said one clock phase to connect the first terminal of the second feedback capacitor to the input of the amplifying means, and a fourth switch operated in said other clock phase to connect the first terminal of the second feedback capacitor to the reference potential.

6. The circuit of claim 4 or claim 5 wherein the circuit is incorporated into an integrated circuit chip.

7. The circuit of claim 6 wherein said switches are transistors incorporated into the integrated circuit chip.

8. An analog device comprising a plurality of cascaded circuits, each of said circuits including amplifying means, a switched capacitor network connected to an input of the amplifying means and a first feedback capacitance connected between an output of the amplifying means and the input to the amplifying means, each circuit being CHARACTERIZED IN THAT the switched capacitor network comprises, a sampling capacitance switched during a clock phase for sampling an input signal to the amplifier for transferring the resulting sample charge to the first feedback capacitance and switched during another clock phase to withdraw the same charge from the first feedback capacitance, and wherein each circuit is further CHARACTERIZED BY a second feedback capacitance switched in one of the clock phases to acquire a charge proportional to the output voltage of the amplifying means and switched in another phase to distribute any charge acquired during said one clock phase with the first feedback capacitance.

* * * * *